United States Patent
Schmitz et al.

(10) Patent No.: US 6,177,303 B1
(45) Date of Patent: Jan. 23, 2001

(54) METHOD OF MANUFACTURING A SEMICONDUCTOR DEVICE WITH A FIELD EFFECT TRANSISTOR

(75) Inventors: Jurriaan Schmitz; Pierre H. Woerlee; Andreas H. Montree, all of Eindhoven (NL)

(73) Assignee: U.S. Philips Corporation, New York, NY (US)

( * ) Notice: Under 35 U.S.C. 154(b), the term of this patent shall be extended for 0 days.

(21) Appl. No.: 09/379,959

(22) Filed: Aug. 24, 1999

(30) Foreign Application Priority Data

Sep. 28, 1998 (EP) .................................................. 98203246

(51) Int. Cl.$^7$ .................................................. H01L 21/337
(52) U.S. Cl. ........................... 438/194; 438/291; 438/299
(58) Field of Search .................................... 438/194, 303, 438/306, 586, 592, 291, 299

(56) References Cited

U.S. PATENT DOCUMENTS

| | | | |
|---|---|---|---|
| 5,856,225 | * | 1/1999 | Lee et al. ............................... 438/291 |
| 6,015,747 | * | 1/2000 | Lopatin et al. ....................... 438/586 |
| 6,022,783 | * | 2/2000 | Wu ........................................ 438/303 |
| 6,033,963 | * | 3/2000 | Huang et al. ........................ 438/303 |

FOREIGN PATENT DOCUMENTS

2757312A1    6/1998   (FR) .

OTHER PUBLICATIONS

"Sub–100nm Gate Length Metal Gate NMOS Transistors Fabricated by a Replacement Gate Process", by A. Chatterjee et al, IEDM 97, p. 821–824.

* cited by examiner

*Primary Examiner*—David Nelms
*Assistant Examiner*—Dung A Le
(74) *Attorney, Agent, or Firm*—Steven R. Biren

(57) ABSTRACT

In the known replacement gate process, the relatively high-ohmic poly gate is replaced by a low-ohmic metal gate by depositing a thick oxide layer and subsequently planarizing this layer by CMP until the gate is reached, which gate can be selectively removed and replaced by a metal gate. The process is simplified considerably by providing the gate structure as a stack of a dummy poly gate (4) and a nitride layer (5) on top of the poly gate. When, during the CMP, the nitride layer is reached, the CMP is stopped, thereby precluding an attack on the poly. The nitride and the poly are selectively removed relative to the oxide layer (10).

2 Claims, 3 Drawing Sheets

METHOD OF MANUFACTURING A SEMICONDUCTOR DEVICE WITH A FIELD EFFECT TRANSISTOR

BACKGROUND OF THE INVENTION

The invention relates to a method of manufacturing a semiconductor device with a field effect transistor, in which method a semiconductor body is provided, at a surface, with a source region and a drain region, while using a doping mask containing a polycrystalline silicon (hereinafter referred to as poly), and in which method subsequently a dielectric layer is provided which is subjected to a material-removing treatment, such as etching or polishing, to remove a part of its thickness, so that the poly-containing doping mask is exposed again, whereafter said poly-containing doping mask is removed by means of a selective etch step and, subsequently, a conductive layer is provided in the resultant recess in the dielectric layer, which conductive layer constitutes the gate of the transistor. Such a method is known, inter alia, from the article "Sub-100 nm gate length metal gate NMOS transistors fabricated by a replacement gate process" by A. Chatterjee et. al., IEDM 97, pp. 821/824. The "replacement gate process" enables MOS transistors with a metal gate to be manufactured in a self-recording manner, instead of the customary polysilicon gates which have a much higher resistance.

In the known process, a dummy gate of polysilicon is formed in the same manner as the poly gate in standard CMOS processes. After the formation of the source and drain regions, an oxide layer which serves as the dielectric layer is deposited, whereafter the thickness of the dielectric layer is reduced down to the poly by means of chemico-mechanical polishing (hereinafter referred to as CMP). Subsequently, the poly of the dummy gate is removed by selective etching. The resultant recess in the oxide layer is filled by a metal gate of Al or W.

In practice it has been found that the reproducibility of this process is limited. In particular the point in time at which the chemico-mechanical polishing operation of the oxide layer is interrupted proved to be very critical. If the CMP is stopped too early, the remaining oxide makes it very difficult to remove the poly. If the CMP process is continued too long, then the height of the gate to be formed eventually proves to be ill-defined.

SUMMARY OF THE INVENTION

It is an object of the invention to provide, inter alia, a "replacement gate" process having a better reproducibility. To achieve this, a method of the type described in the opening paragraph is characterized in accordance with the invention in that the poly-containing doping mask is provided in the form of a double layer comprising a first sub-layer of polysilicon and a second sub-layer, which is provided on the first sub-layer and consists of a material having a greater resistance to the material-removing treatment than polysilicon, and which material can be selectively etched relative to said dielectric layer. The invention is based, inter alia, on the recognition that poly has a fairly low resistance to CMP, which is the reason why the point in time at which CMP is interrupted is so critical. By providing, in accordance with the invention, above said poly a layer of another material having a greater etch resistance than poly, the etch rate is reduced substantially when the second sub-layer is reached.

An important embodiment of a method in accordance with the invention is characterized in that the dielectric layer is formed by silicon oxide and the second sub-layer is formed by a layer containing silicon nitride.

BRIEF DESCRIPTION OF THE DRAWING

These and other aspects of the invention will be apparent from and elucidated with reference to the embodiments described hereinafter, to be read in conjunction with the drawing, in which.

DESCRIPTION OF THE PREFERRED EMBODIMENTS

Although the invention will hereinafter be explained by means of a single MOS transistor, it will be obvious to those skilled in the art that the process described herein can also be used to manufacture CMOS or BICMOS integrated circuits which are known per se.

Figure 1:
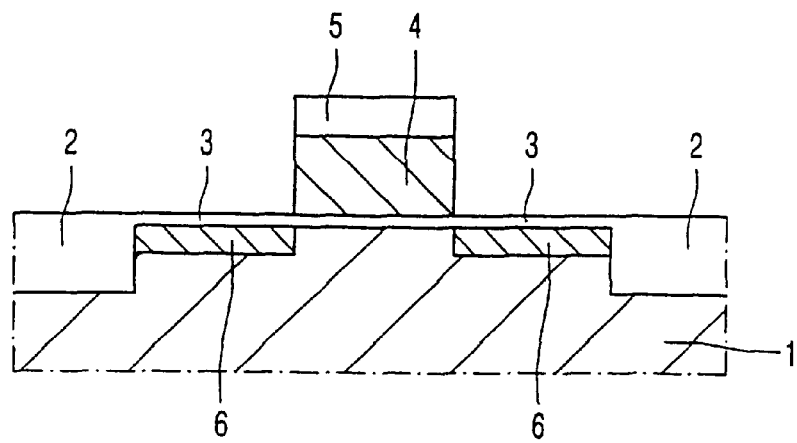
FIGS. 1 through 8 are sectional views of a semiconductor device at various stages in the manufacture of the device by means of a method in accordance with the invention.
Figure 2:
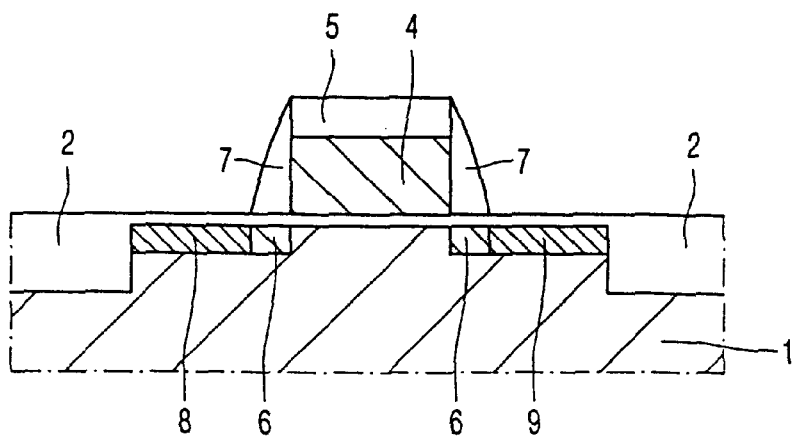
Figure 3:
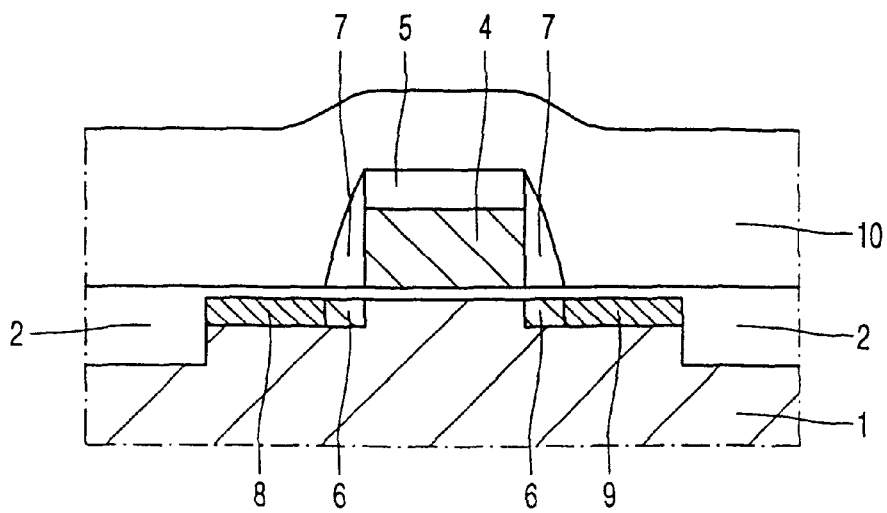
Figure 4:
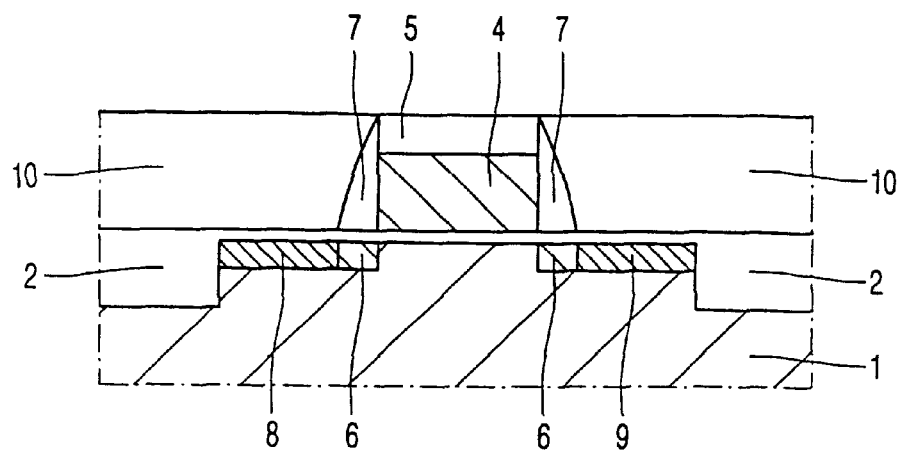

The device comprises a semiconductor body which, in this case, is made of silicon but which may alternatively be made of another suitable semiconductor material, which semiconductor body has a surface region 1 which borders on a surface and which is of a first conductivity type, in this example the p-type (FIG. 1). In the surface region 1, an active region is defined in a customary manner by a field oxide 2. The active region is covered with a thin layer 3 of, for example, silicon oxide which, dependent upon subsequent process steps, may or may not be used as a gate dielectric. After the formation of the gate oxide 3, a double layer is deposited, which comprises a layer of polycrystalline or amorphous Si or $Ge_xSi_{1-x}$ and, on said poly layer, a second layer, for example a nitride layer such as silicon nitride. In a customary, photolithographic manner, the dummy gate 4, covered with the nitride layer 5, is formed from this double layer, whereafter the source/drain extensions 6 are provided by a relatively slight implantation of P or As ions. Subsequently, the sides of the dummy gate 4 are provided, in a manner which is known per se, with spacers 7, for example by deposition and anisotropic backetching of a silicon oxide layer. Next, the source and drain regions 8 and 9, respectively, are formed, which regions are heavily doped as a result of said implantation with P or S ions. In a next stage, shown in FIG. 3, a relatively thick dielectric layer 10 is deposited from the vapor phase, in this example silicon oxide; of course, also other suitable electrically insulating materials can be used.

Figure 5:
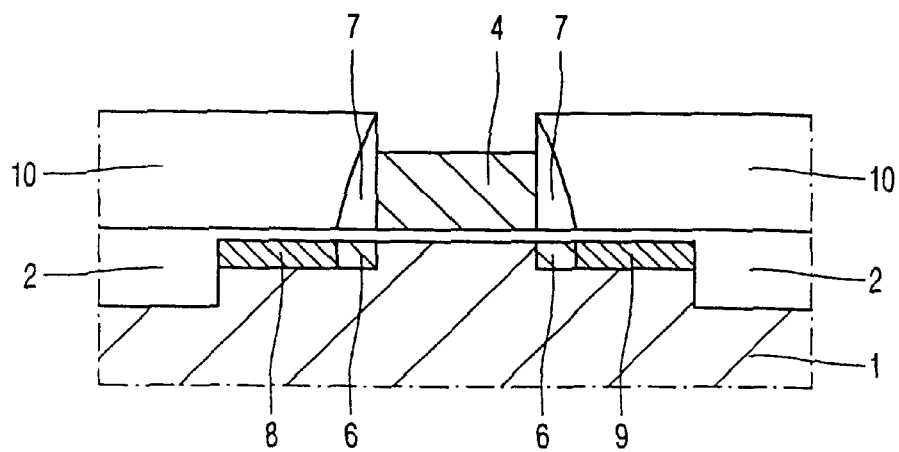
Figure 6:
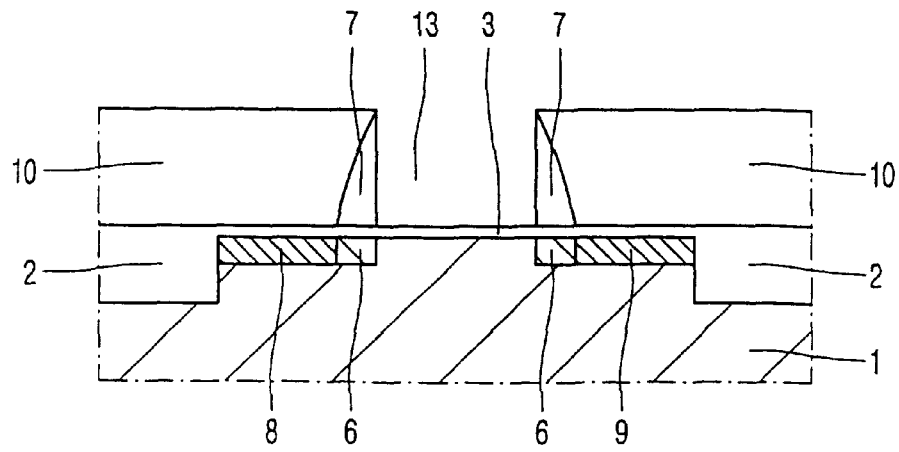

Subsequently, a part of the thickness of the layer 10 is removed by means of chemico-mechanical polishing (CMP). For this purpose use can be made, for example, of a slurry of silicon oxide buffered in a solution of ammonium hydroxide. The material-removing treatment is ended when the nitride layer 5 has been reached. Since the poly layer 4 remains covered with the nitride 5 during the CMP step, said poly is not attacked, so that the reproducibility of the process is improved substantially. In a next step, shown in FIG. 5, the silicon nitride layer 5 is selectively removed relative to the silicon oxide, for example by etching in phosphoric acid. Next, the poly of the layer 4 is selectively removed, for example by plasma etching using $HBr+Cl_2$, see FIG. 6. At this stage of the process, a structure has been obtained which comprises a relatively thick oxide layer 10 with an aperture or recessed portion 13, which is accurately aligned relative to the source and drain regions of the transistor.

Preferably, the oxide layer 3 is removed, whereafter a new gate dielectric 11 is formed by thermal oxidation.

Figure 7:
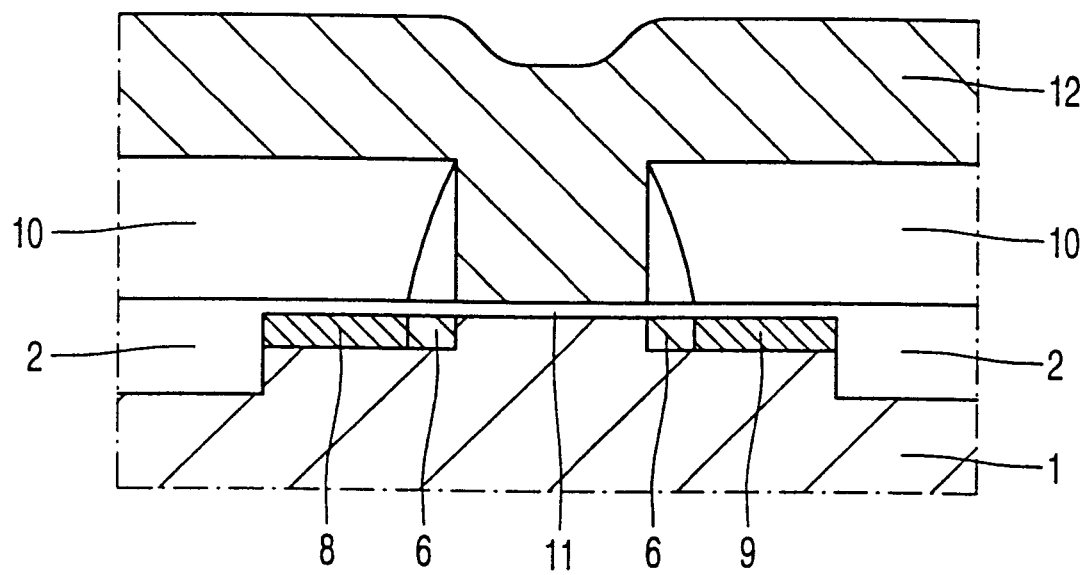
Figure 8:
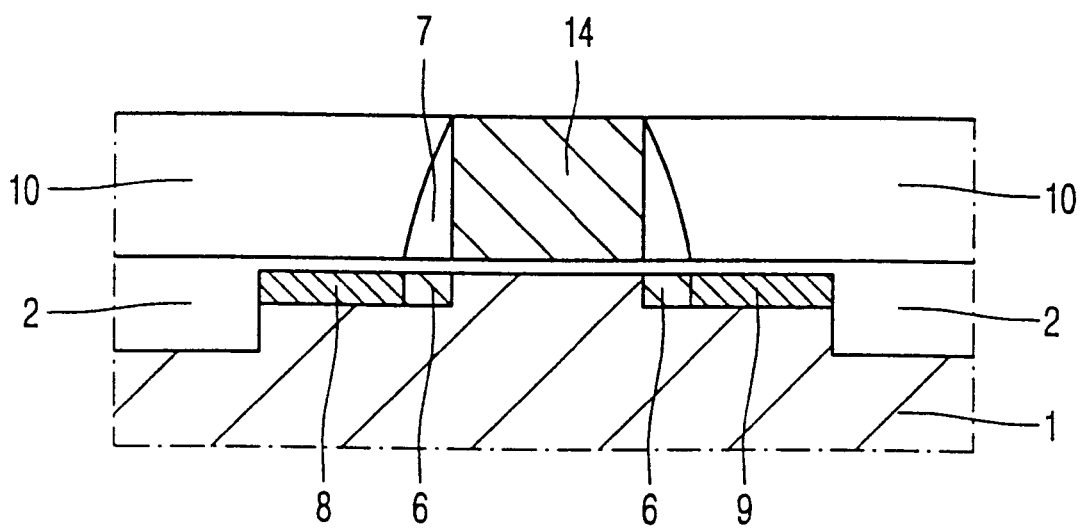

Subsequently, a metal layer 12 is applied, in a manner which is known per se, which completely fills the recessed portion 13, see FIG. 7. The metal layer 12 may be made, for example, of Al or W or of another suitable metal or combination of metals. In a subsequent step, the layer 12 is patterned to obtain the gate 14 of the transistor. Said patterning can be carried out by means of a mask, the metal of the gate extending over the oxide layer 10 beyond the recessed portion 13. Preferably, however, no mask is used to remove so much of the metal layer 12 that a gate 14 is formed, as shown in FIG. 8, which is entirely recessed in the oxide layer 10, for example by a CMP treatment.

It will be obvious that the invention is not limited to the example described herein, and that within the scope of the invention many variations are possible to those skilled in the art. For example, instead of silicon nitride for the layer 5, also other suitable materials or combinations of materials may be used, such as silicon oxynitride.

What is claimed is:

1. A method of manufacturing a semiconductor device with a field effect transistor, in which method a semiconductor body is provided, at a surface, with a source extension and a drain extension, and with a source region and a drain region, while using a doping mask containing a polycrystalline silicon (hereinafter referred to as poly), and in which method subsequently a dielectric layer is provided which is subjected to a material-removing treatment, such as etching or polishing, to remove a part of its thickness, so that the poly-containing doping mask is exposed again, whereafter said poly-containing doping mask is removed by means of a selective etch step and, subsequently, a conductive layer is provided in the resultant recess in the dielectric layer, which conductive layer constitutes the gate of the transistor, wherein the poly-containing doping mask is provided in the form of a double layer comprising a first sub-layer of polysilicon and a second sub-layer, which is provided on the first sub-layer and consists of a material having a greater resistance to the material-removing treatment than polysilicon, and which material can be selectively etched relative to said dielectric layer, and wherein said source and drain extensions and said source and drain regions are all provided having substantially the same height.

2. A method as claimed in claim 1, characterized in that the dielectric layer is formed by silicon oxide and the second sub-layer is formed by a layer containing silicon nitride.

* * * * *